United States Patent [19]

Nelson et al.

[11] 4,341,590
[45] Jul. 27, 1982

[54] SINGLE SURFACE LPE CRYSTAL GROWTH

[75] Inventors: Gary L. Nelson, Apple Valley; William A. Harvey, Minneapolis, both of Minn.

[73] Assignee: Sperry Corporation, New York, N.Y.

[21] Appl. No.: 257,830

[22] Filed: Apr. 27, 1981

[51] Int. Cl.$^3$ .......................................... C30B 19/12
[52] U.S. Cl. .................................. 156/624; 156/621; 156/DIG. 63; 427/300
[58] Field of Search ............... 156/DIG. 63, 621, 622, 156/624; 252/62.57; 427/300, 436; 118/406; 148/6.14 R

[56] References Cited

U.S. PATENT DOCUMENTS

| | | | |
|---|---|---|---|
| 3,359,143 | 12/1967 | Heywang et al. | 148/174 |
| 3,419,424 | 12/1968 | Steggewentz et al. | 148/174 |
| 3,493,444 | 2/1970 | Sirtl et al. | 148/175 |
| 3,533,856 | 10/1970 | Panish et al. | 156/624 |
| 3,546,032 | 12/1970 | Basart | 156/624 |
| 4,200,484 | 4/1980 | Glass | 156/624 |
| 4,259,365 | 3/1981 | Ruppel et al. | 156/624 |

FOREIGN PATENT DOCUMENTS 3002671 7/1980 Fed. Rep. of Germany ...... 156/624

Primary Examiner—Gregory N. Clements
Attorney, Agent, or Firm—Douglas L. Tschida; Kenneth T. Grace; Marshall M. Truex

[57] ABSTRACT

A method and apparatus for growing liquid phase epitaxial (LPE) crystals upon only one surface of a supporting substrate. The method requiring the insertion of a gasket between a pair of substrates, upon whose exposed surfaces it is desired to grow an LPE crystal. The gasket essentially acting to contain a meniscus of entrapped flux and thereby entrap an air bubble between the substrates so as to prevent growth upon the interior surfaces of the assembly.

10 Claims, 3 Drawing Figures

SINGLE SURFACE LPE CRYSTAL GROWTH

BACKGROUND OF THE INVENTION

The present invention relates to liquid phase epitaxial processes, wherein it is desired to grow an LPE film upon only one surface of a supporting crystalline substrate.

Liquid phase epitaxial processes generally involve the high temperature growth of single crystal films upon single crystal substrates. Such processes require that the growth, crystal type, lattice size and thermal expansion characteristics be constrained to match the corresponding characteristics of the substrates. The processes thus produce single crystal structures having uniform and continuous lattice arrangements, and also typically having magnetic, optical and compositional characteristics different in the epitaxially grown portion(s) of the structure.

Attendant with these type processes is the requirement of having to immerse the supporting crystalline substrate into the melt, and which step necessarily results in the growth of an LPE crystalline film upon the upper and lower surfaces of the substrate, unless measures were taken to prevent the growth upon one of the surfaces. If steps were not taken to prevent the undesired growth, the common practice employed by those skilled in the art has been to mechanically lap and polish the undesired LPE film from the undesired surface. Such an additional step, though, oftentimes requires numerous substeps, depending upon the thickness of the undesired growth. The lapping step, in general though, requires a great deal of time and reduces the effective yield of any such LPE process, due to the breakage that occurs during the lapping operation.

In particular, during the lapping operation, the undesired crystalline growth is removed via subjecting the undesired growth to a buffing pad upon which successively smaller grits and finally Syton TM are applied, until the undesired growth has been removed. As a consequence of this protracted lapping/polishing operation numerous additional problems often occur, such as breaking, cracking, scratching, wedging and lensing of the supporting crystalline substrate and possibly the LPE crystalline film. Consequently, it is desirable that an improved method be developed which either does away with the problem of the undesired growth or minimizes the amount of time and steps of any lapping/polishing operation.

While numerous prior art examples can be found of processes wherein a lapping/polishing operation is employed, little can be found on the subject of not growing the undesired film at all. Relative to an example of an explanation of the lapping/polishing operation, attention is directed to an article by J. M. Robertson, et al, entitled "Garnet Substrate Preparation By Homoepitaxy" in the *Journal of Crystal Growth* 18 (1973) pp. 294–296. The problem of flux adhesion and the use of acid etching is also discussed in U.S. Pat. No. 3,079,240 issued to J. P. Remeika.

The most common practice for preventing the undesired growth altogether, however, has been to grow the LPE crystalline films upon the exposed surfaces of two supporting crystalline substrates that are placed back to back prior to being inserted into the melt. The theory being that the two substrates will be held together by a strong atmospheric pressure or by a solid/solid self-welding effect, due to the optically flat mating surfaces of the supporting crystalline substrates. An excellent article on this subject by B. S. Hewitt et al, entitled "Technique For Controlling the Properties of Magnetic Growth Films" can be found in the *IEEE Transactions on Magnetics*, Vol. Mag-9, No. 3, September, 1973, pp. 366–372. It has been applicants' experience, though, that upon employing a back to back method, some flux always penetrates between the supporting crystalline substrates and some minimal lapping/polishing is always required. Further, a great deal of breakage has been experienced, due to weakened substrates. The weakened condition resulting from microfractures that occur during the cooling of the back to back structure; and the microfractures, in turn, resulting from the differential thermal expansion between the substrates and the intermediate flux.

It is therefore a primary object of the present invention to selectively enable the growth of an LPE crystalline films upon only one surface of a supporting crystalline substrate.

It is a further object to prevent the growth upon the one surface via the employment of a gasket between two supporting crystalline substrates, so that the LPE crystalline films will not grow on the surfaces interior to the gasket.

It is a still further object to improve the testability of the characteristics of an individual layer in a multi-layer structure.

These objects and others will become more apparent, as well as their attainment, upon a reading of the following description.

SUMMARY OF THE INVENTION

A method and apparatus for growing LPE crystalline films upon supporting crystalline substrates and ensuring that undesired growth does not occur over substantial areas of the surface of said substrate. The improved method generally comprising the inclusion of the step in an LPE process of preparing a combination of at least two supporting crystalline substrates and placing a gasket therebetween for trapping an air bubble between the lower surface of one substrate and the upper surface of the other substrate during the immersion of the assembly into a melt.

The apparatus essentially comprising a gasket ring of a suitable shape and suitable material and having means attached thereto for maintaining the placement of the gasket between the two substrates. The gasket material typically being platinum. The gasket ring further typically being formed from a platinum form and about which platinum wire is wound and which wire and form are compressed to form flat surfaces for mating to the surfaces of the substrates. The shape of the gasket ring also typically adapted to the shapes of the various substrates.

DESCRIPTION OF THE PREFERRED EMBODIMENT

Figure 1:
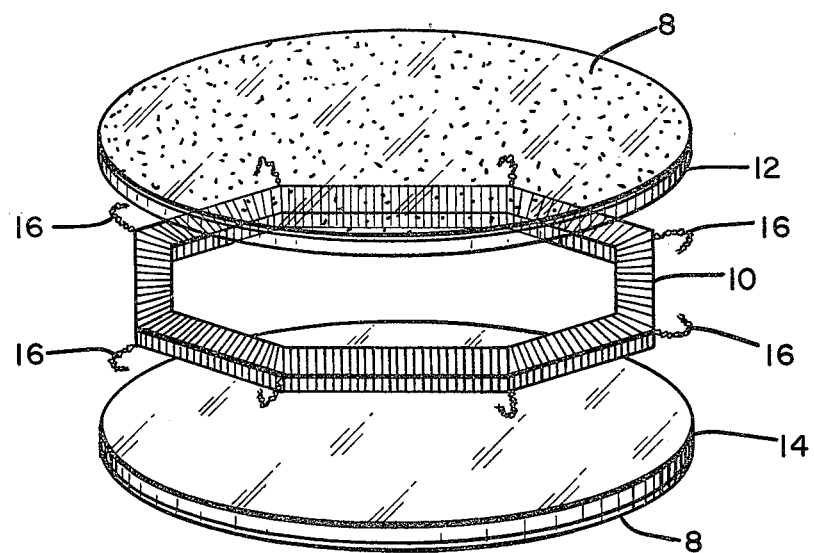
FIG. 1 is an isometric representation of the top and bottom substrates and the gasket ring that is placed therebetween.

Referring to FIG. 1, an exploded view is shown of the platinum gasket 10 of the present invention relative to its placement with respect to a top substrate 12 and a bottom substrate 14, and upon which substrates a crystalline film 8 has been grown. While the substrate material is not critical to the operability of the present invention, it typically is a gadolinium gallium garnet (GGG). This substrate material is generally used for growing LPE films 8 having a generalized formula of $Re_3Fe_5O_{12}$, where Re is one of the rare earths or combination of rare earth elements but where only three atoms of the rare earth exist per formula, and where Fe is iron or a combination of iron with other elements, but with only five atoms per formula. These films 8, thus typically exhibit magnetic properties that enable the films to sustain magnetic bubbles and/or magnetic stripe domains and which bubbles or stripe domains in turn can be effectively used either in magnetic memories or magneto-optic light deflectors, to name but a few applications. It is to be recognized though that the present invention has broader applications and can be used regardless of the specific LPE crystalline film that is to be grown on a supporting substrate.

Also spaced about the platinum gasket 10 are a plurality of platinum hooks 16 that are formed from platinum wire that has been wrapped about a platinum form interior to the platinum gasket 10, but which construction will be discussed in more detail hereinafter. While the hooks 16 may not be needed in some applications, wherein the gasket/substrate assembly is otherwise held together, applicants have employed them in substantially all of their embodiments to date. During use, the hooks are alternately wrapped over the edge of the top and bottom substrates 12 and 14 so as to positionally affix the platinum gasket 10 relative to the top and bottom substrates 12 and 14. The hooks 16 thus prevent the platinum gasket 10 from slipping out of the assembly, an consequently prevent exposing the interior region of the gasket 10 to the flux and releasing the entrapped air. The hooks may, however, not be necessary in processes such as described in Hewitt, wherein the substrate holder holds the gasket/substrate assembly in compression so that the gasket does not slip out.

It should be noted too that the shape of the gasket may be adjusted depending upon the physical shape of the substrate and/or the area that is desired to be left unexposed. In particular, various shapes have been employed by the applicants, such as a "daisy wheel" having six pointed sides (reference FIG. 3), a "ship's wheel" (i.e. round), and the "octagon/octopod" seen in FIG. 1. The octagon/octopod has been primarily relied upon because many of the substrates which are employed in applicants LPE process have one or more sides thereof flatted so as to identify the lattice orientation of the crystal. Therefore, it is desirable that the platinum gasket 10 have a corresponding shape.

While the shape of the platinum gasket 10 may vary, and consequently its manner of construction, the present "octagon/octopod" shape is typically produced in the following manner. An O-ring is made from a 0.040 inch platinum wire and then wrapped with a helix of 0.015 inch wire. At every 45 degrees of the O-ring, the 0.015 inch wire is extended out to form a leg and then bent back to the O-ring to continue the helical wrap. The loops of wires extending out to form the legs are then pulled out to tighten the helix, cut at their apexes and twisted into pairs, while maintaining the tension on each piece of cut wire. It has also been determined that, if the helix has a right-hand thread, twisting the legs into a left-hand thread tends to pull the elements of the helix closer to each other, and thus minimize the need for external tension. The wrapped O-ring is then bent to form an octagon for accommodating the four flat edges of the upper and lower cut substrates, yet still approximating the desired circle of unexposed area between the substrates. The octagon/octopod is then compressed in a press to reduce its thickness from 0.070 inches down to 0.0425 or 0.0445 inches, and thereby ensure a better seal between the substrates 12 and 14, even though a flux tight seal is not required. The weight of the typical octagon/octopod is also approximately 3.1 grams and the compressed width of each leg is approximately 0.1 inches.

Figure 2:
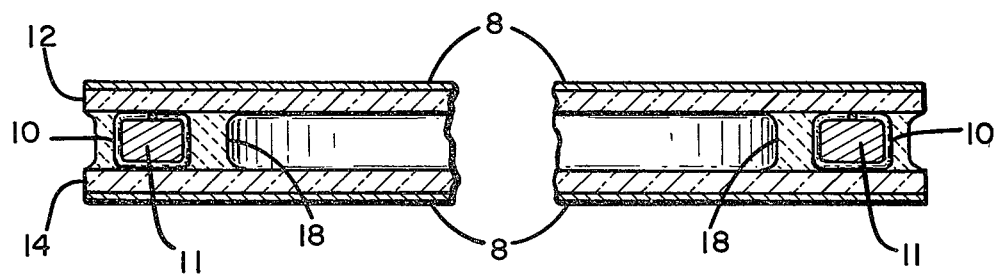
FIG. 2 is a cross sectional view of the assembled combination of FIG. 1 after the gasket/substrate assembly has been immersed in a melt.

Referring now to FIG. 2, a cross sectional view is shown of the gasket/substrate assembly after its immersion in a melt. In particular, the grown LPE crystalline film 8 can be seen on the surfaces of the substrates 12 and 14. From this view too, the gasket 10 and its center form 11 can be seen better. Further, it is to be noted that during the growth of the LPE crystalline films 8, a meniscus of entrapped flux occurs about the gasket 10. It is also to be noted that the wetting characteristics of the melt demonstrates, in relative terms, an affinity for the platinum gasket 10, as opposed to the substrates 12 or 14. This affinity of the flux for the platinum gasket 10, however, appears to be small. Rather, the capillary action of the melt dominates, since the flux leaks a limited distance about the gasket 10 towards the center of the assembly. The distance, however, is limited by the counteracting, entrapped air bubble and the related internal-to-external pressure differential, which stops the flux from migrating further towards the center. Specifically, in the work done to date using a one inch substrate and nutrient/flux melt compositions of $Bi_1Lu_2Fe_5O_{12}/PbO-Bi_2O_3$ and $(YLaTm)_3Fe_4Ga_1O_{12}/PbO-B_2O_3$, the meniscus of entrapped flux, for a gasket/substrate assembly that is spaced apart approximately the 0.045 mils, has demonstrated a limited migration of approximately 0.08 inches inside the gasket. The relative separation of the substrates 12 and 14 acting to increase area upon which the countervailing forces act. Thus, the entrapped air bubble leaves substantially all of the interior area of the gasket/substrate assembly free of undesired growth.

Due to the limited growth between the substrates upon removing the gasket/substrate assembly from the melt, cooling the assembly from the approximate growth temperatures of 700°–900° C. to room temperature and undoing the legs 16, the substrates are separated with relative ease. Further, while deleterious effects sometimes occur in the areas wherein the meniscus of entrapped flux 20 touches the substrates 12 and 14, no defects have occurred, to date, in the areas of the substrates that have been exposed to the entrapped air. The lack of exposure of the substrates to the flux, thus appears to have removed the problem of microcracking, which in large part, as mentioned, appears to be due to the differentials in the respective coefficients of thermal expansion between the flux and the substrates.

The solution of this problem has also facilitated the testability of individual layers in multilayer structures. One can now grow films using the above described single sided mode for one or more layers, and then switch to double sided growth as desired, for one or more other layers. These double sided layers facilitate testing, since it is now possible to separate individual layers from one side to the other of a substrate, so that individual sides and layers can be tested and compared, separate from one another. The peculiar test growth procedure would, however, depend upon the specific multilayer structure that was being grown and tested.

While the present invention has been described with reference to the use of two substrates, it is to be recognized that a disk or other dummy, substrate-like object may be used in lieu of one of the substrates, such that the desired LPE crystalline film growth occurs only on the exposed surface of one substrate. Such a disk should also typically be made from a material like that used for the gasket 10. In particular, applicants have used platinum disks. It is to be further recognized that while applicants work has been directed to LPE crystalline films, exhibiting magnetic properties, many other types of LPE films can be grown in melts containing fluxes requiring materials other than platinum. Thus, for other types of work, it is expected that one could substitute a different gasket and/or disk material to the same effect as described above.

Attention should next be directed to the fact that for the present platinum gasket 10 work, the capillary action and wetting characteristic of the melt are such that the flux leaks around the platinum gasket 10, as opposed to the gasket completely sealing off the flux. This leakage generally occurs due to the wire-wrap striations in the platinum gasket 10. It may therefore, in some types of work, be desirable to use a washer having flatter surfaces that mate better with the top and bottom substrates 12 and 14 and thus block the capillary action of the melt. While detailed experiments have not been conducted with the use of gaskets made from many different materials and many different shapes it is at least expected that for the washer-type gasket 10, the effect would be the same and the interior of the washer would remain free of flux growth.

Figure 3:
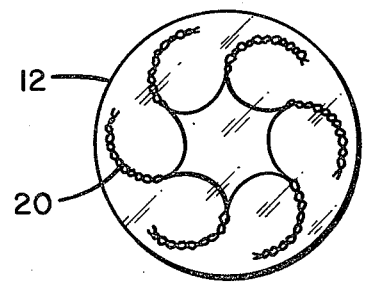
FIG. 3 is a topographic view of a daisy wheel gasket.

Attention is also directed to FIG. 3, wherein a "daisy wheel" gasket 20 is shown relative to a substrate 12. This structure too works and produces areas free of undesired growth within each of the arms of the wheel, even though growth occurs about the individual arms of the wheel. Applicants believe that this shape works because the capillary action of the melt is not sufficient to force the individual entrapped air bubble through the openings of the arms.

While the present invention has been described with respect specific-type melts and materials, it is to be expected that variations may suggest themselves to those of skill in the art upon employing the teachings of the present specification. The merits of the present invention are therefore deemed to be quite broad, and consequently the following claims should be interpreted to include those equivalents encompassed by the spirit and scope of the presently claimed invention.

What is claimed is:

1. In a liquid phase epitaxial process for growing a crystalline film upon a supporting crystalline substrate by immersing said substrate in a melt containing a nutrient and a flux, the improvement comprising the inclusion of a step therein prior to immersion of:

assembling means for entrapping an air bubble between a first and second substrate, so that each of said substrates have an exposed upper and lower surface, whereby upon immersion of said assembly into said melt said crystalline film is grown primarily upon the exposed surfaces of said first and second substrates, the growth upon the interior surfaces occurring in only those areas not exposed the entrapped air bubble.

2. In a liquid phase epitaxial process for growing a crystalline film upon a supporting crystalline substrate by immersing said substrate in a melt containing a nutrient and a flux, the improvement comprising the inclusion of a step therein prior to immersion of:

assembling a gasket between a first and second substrate, so that each of said substrates have a single exposed upper or lower surface, whereby upon immersion of said assembly into said melt said crystalline film is grown primarily upon the exposed surfaces of said first and second substrates, the growth upon the interior surfaces being limited by an air bubble entrapped by said gasket.

3. A liquid phase epitaxial process as set forth in claim 2 wherein one of said first or second substrates is a dummy substrate.

4. A liquid phase epitaxial process as set forth in claim 2 wherein said gasket includes legs radiating therefrom for affixing said gasket between said first and second substrates, thereby preventing said gasket from slipping out from between the assembly and releasing the entrapped air bubble.

5. A liquid phase epitaxial process as set forth in claim 4 wherein said gasket has an octagon shape.

6. A liquid phase epitaxial process as set forth in claim 4 wherein said gasket has a daisy wheel shape.

7. A liquid phase epitaxial process as set forth in claim 2 wherein said gasket is formed in the shape of a washer.

8. A liquid phase epitaxial process as set forth in claim 2 wherein said gasket is made from platinum.

9. A liquid phase epitaxial process as set forth in claim 2 wherein said gasket is a form about which a wire is wrapped so as to encompass said form, said wrapped assembly further compressed to reduce the thickness thereof.

10. A liquid phase epitaxial process as set forth in claim 9 wherein said gasket includes at least one wire leg protruding from said compressed assembly, whereby said leg can be used to maintain said gasket between said first and said second substrate during said immersion of said assembly into said melt said crystalline film.

* * * * *